United States Patent [19]
Unami et al.

[11] Patent Number: 6,091,180
[45] Date of Patent: Jul. 18, 2000

[54] PIEZOELECTRIC RESONATOR AND ELECTRONIC COMPONENT USING THE SAME

[75] Inventors: Toshihiko Unami, Omihachiman; Toshiyuki Baba, Moriyama; Toshio Nishimura, Shiga-ken; Tatsunori Kakuda, Takaoka; Takeshi Yamazaki, Ishikawa-ken; Tetsuo Takeshima, Toyama; Shigemasa Kusabiraki, Takaoka; Yutaka Kawai, Hakui; Hirohide Yoshino, Toyama-ken, all of Japan

[73] Assignee: Murata Manufacturing Co., Ltd., Japan

[21] Appl. No.: 09/120,898

[22] Filed: Jul. 22, 1998

[30] Foreign Application Priority Data

Oct. 1, 1997 [JP] Japan ................................. 9-286177

[51] Int. Cl.[7] .................................................. H01L 41/08
[52] U.S. Cl. .................................... 310/328; 310/366
[58] Field of Search ................................ 310/328, 348, 310/366

[56] References Cited

U.S. PATENT DOCUMENTS

| | | | |
|---|---|---|---|
| 5,900,790 | 5/1999 | Unami et al. | 333/187 |
| 5,912,601 | 6/1999 | Unami et al. | 333/187 |
| 5,925,971 | 7/1999 | Unami | 310/328 |

*Primary Examiner*—Thomas M. Dougherty
*Attorney, Agent, or Firm*—Graham & James LLP

[57] ABSTRACT

A piezoelectric resonator which vibrates in a longitudinal vibration mode includes first insulating films disposed on a side surface of a base member so as to cover at least part of exposed portions of a first group of the internal electrodes and second insulating films disposed on the side surface of the base member so as to cover at least part of the exposed portions of a second group of the internal electrodes. A first thin-film external electrode extends continuously in the longitudinal direction of the base member on the first insulating films and a second thin-film external electrode extends continuously in the longitudinal direction of the base member on the second insulating film. A first conductive resin film and a second conductive resin film are respectively provided on the first thin-film external electrode and the second thin-film external electrode such that even if the thin-film external electrodes are broken or damaged, the piezoelectric resonator still functions.

18 Claims, 12 Drawing Sheets

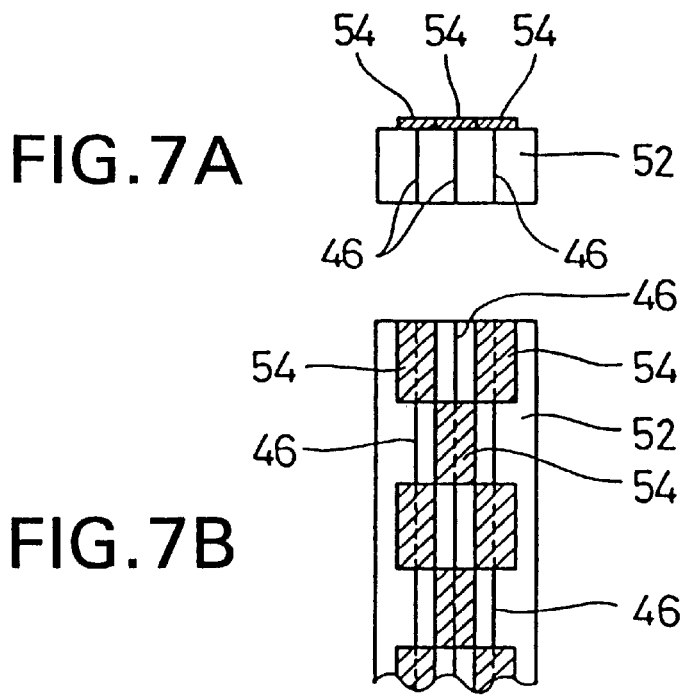
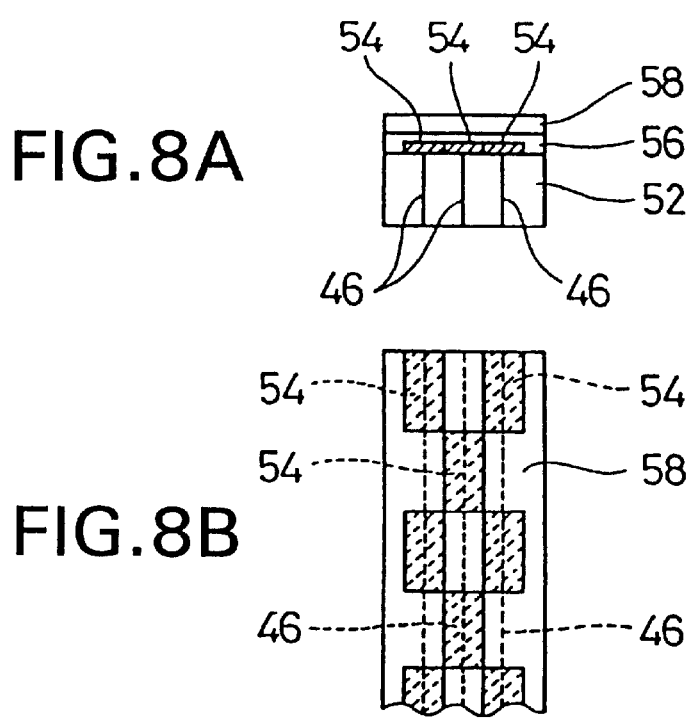

FIG. 13
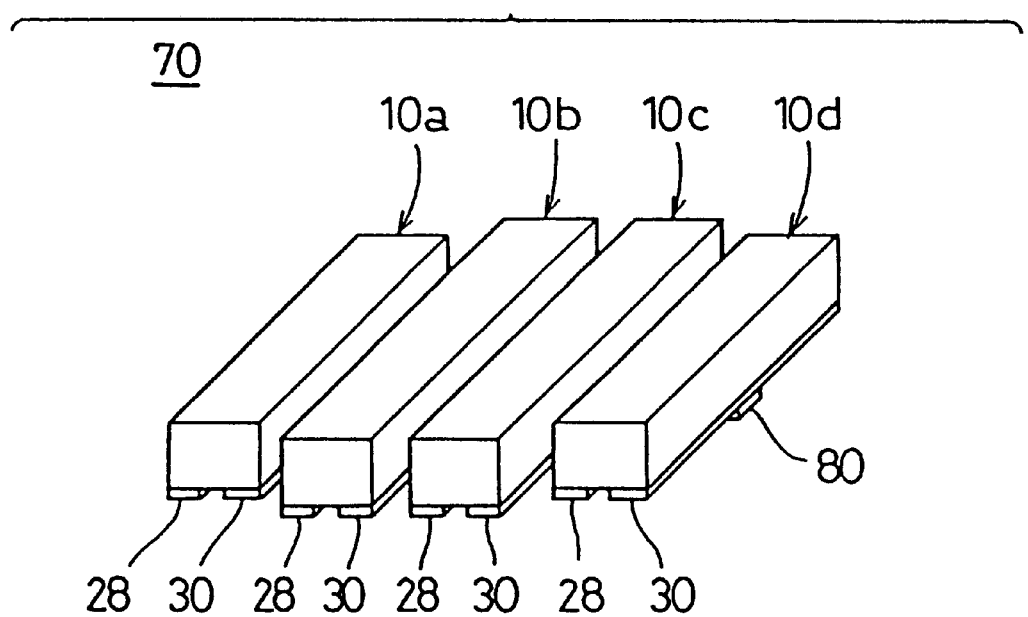
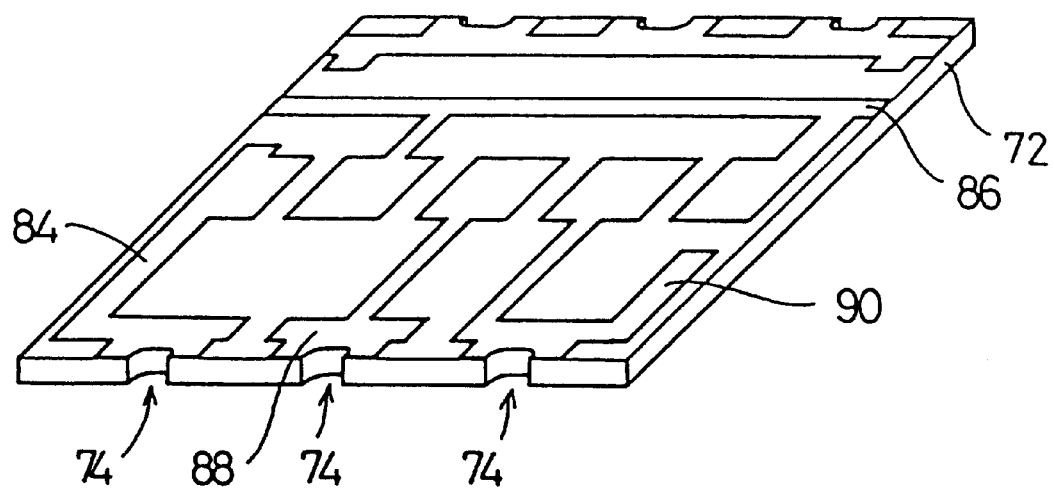

PIEZOELECTRIC RESONATOR AND ELECTRONIC COMPONENT USING THE SAME

BACKGROUND OF THE INVENTION

1. Technical Field of the Invention

The present invention relates to piezoelectric resonators and electronic components incorporating piezoelectric resonators, and in particular, for example, to a piezoelectric resonator utilizing a mechanical resonance and an electronic component including such a piezoelectric resonator.

2. Description of the Related Art

Piezoelectric resonators utilizing piezoelectric mechanical resonance include, for example, a piezoelectric resonator in which electrodes are provided on the surfaces of a piezoelectric plate which is polarized along a thickness direction thereof. According to such a piezoelectric resonator, applying an AC electric field across the electrodes excites the piezoelectric resonator to have a longitudinal vibration mode or radial vibration mode. However, this type of piezoelectric resonator utilizes an unstiffened mode in which electric field directions and polarization directions differ from vibration directions, and has a small electromechanical coupling coefficient and a relatively small difference ΔF between the resonant frequency and the antiresonant frequency. The use of the piezoelectric resonator utilizing the above-described unstiffened mode in an oscillator or piezoelectric filter causes disadvantages in which the bandwidth is small and a degree of freedom in component characteristics design is low. Accordingly, in order to solve these disadvantages, the Applicant of the present invention described and claimed in the present application has proposed a layered piezoelectric resonator, shown in FIG. 15, which is configured as a stiffened-mode piezoelectric resonator having a large electromechanical coupling coefficient and a relatively large difference ΔF between the resonant frequency and the antiresonant frequency. It is noted that the device shown in FIG. 15 is the subject of Applicant's co-pending Japanese Patent Application 8-223028 which is not prior art to the present application.

FIG. 15 is an illustration showing one example of a piezoelectric resonator utilizing a stiffened mode. A piezoelectric resonator 1 includes a parallelepiped-shaped base member 2. The base member 2 is formed by alternately laminating a plurality of piezoelectric layers 3 and a plurality of internal electrodes 4. Two piezoelectric layers 3 which are adjacent with one internal electrode 4 provided between them are polarized in opposite directions along a longitudinal direction of the base member 2 as seen in FIG. 15. In one side surface of the base member 2, a groove 5 is formed, and on one side of the groove 5, exposed portions of the internal electrodes 4 are alternately covered with insulating films 6*a*. On another side of the groove 5, the exposed portions of the internal electrodes 4, which are not covered with the insulating films 6*a*, are covered with other insulating films 6*b*. In addition, on both sides of the groove 5, thin-film external electrodes 7*a*, 7*b* are formed on the side surface of the base member 2. Accordingly, the adjacent internal electrodes 4 are respectively connected to the different thin-film external electrodes 7*a*, 7*b*.

In the piezoelectric resonator 1, by applying a signal across the thin-film external electrodes 7*a*, 7*b*, an AC electric field is applied across the adjacent internal electrodes 4. The adjacent piezoelectric layers 3 are polarized in opposite directions as illustrated by the arrows shown in FIG. 15. Thus, an AC electric field is applied to the electrodes 7*a*, 7*b*, whereby the respective piezoelectric layers 3 expand or contract in the longitudinal direction of the base member 2, so that the entire base member 2 is excited to have a fundamental, longitudinal vibration mode and vibrate along the longitudinal axis of the base member 2. As described above, the piezoelectric resonator 1, which utilizes a stiffened mode in which electric field directions and polarization directions are the same as vibration directions, can increase an electromechanical coupling coefficient and ΔF, compared with a piezoelectric resonator utilizing an unstiffened mode. Thus, using this type of piezoelectric resonator in an oscillator or filter enables a large bandwidth and a high degree of freedom in component characteristic design to be achieved.

In this type of piezoelectric resonator, insulating films are disposed on a portion of a side surface of a base, and thin-film external electrodes are provided on the insulating films. Accordingly, the expansion or contraction of the insulating films due to a temperature change may break the thin-film external electrodes located on the insulating films. When the thin-film external electrodes are broken or damaged, no signal is applied to most or all of the internal electrodes, so that the piezoelectric resonator cannot function.

SUMMARY OF THE INVENTION

To overcome the problems described above, the preferred embodiments of the present invention provide a highly reliable piezoelectric resonator or component including such a resonator, that functions, even if its thin-film external electrodes are broken or damaged.

According to a preferred embodiment of the present invention, a piezoelectric resonator includes a base member having a longitudinal direction including a laminated body having a plurality of piezoelectric layers and a plurality of internal electrodes stacked on each other, the piezoelectric layers being polarized in the longitudinal direction of the base member, and the base member vibrating in a longitudinal vibration mode in response to application of electric fields in the longitudinal direction of the base member, first insulating films disposed on a side surface of the base member so as to cover at least a part of exposed portions of a first group of the internal electrodes, second insulating films disposed on the side surface of the base member so as to cover at least a part of exposed portions of a second group of the internal electrodes which are not covered by the first insulating films, a first thin-film external electrode extending continuously in the longitudinal direction of the base member on the first insulating film, a second thin-film external electrode extending continuously in the longitudinal direction of the base member on th e second insulating film, and a first conductive resin film and a second conductive resin film respectively provided on the first thin-film external electrode and the second thin-film external electrode.

In the above described piezoelectric resonator, the first insulating films and the second insulating films may be respectively provided to extend in a widthwise direction at one end and another end of the base member on one identical side surface of the base member. In addition, the first insulating films and the second insulating films may be provided on different side surfaces of the base member.

The preferred embodiments of the present invention further provide an electronic component including the above described piezoelectric resonator, wherein the electronic component includes a substrate provided with pattern electrodes to which the conductive resin films are electrically connected, and the substrate is covered with a cap for covering the piezoelectric resonator.

In the above described electronic component, the plurality of electrodes may be provided on the insulating substrate and the conductive resin films of the plurality of piezoelectric resonators are electrically connected to the pattern electrodes so that a ladder filter is provided.

According to the piezo electric resonator of preferred embodiments of the present invention, a first thin-film external electrode and a second thin-film external electrode are respectively connected to one of the first group of internal electrodes and one of the second group of internal electrodes via first insulating films and second insulating films. Conductive resin film are provided on the first thin-film external electrode and the second thin-film external electrode, such that even if the thin-film external electrode and the second thin-film external electrode are broken or damaged, the conductive films maintain thin-film-external-electrode conduction on both sides of a breakage or damaged area. By supplying a signal to the conductive resin films on the first and second thin-film external electrodes, an AC electric field is applied to the piezoelectric layers so that the base member containing such piezoelectric layers is excited to generate a longitudinal vibration mode.

In addition, by incorporating the piezoelectric resonator described in the preceding paragraphs in an electronic component, such an electronic component can still function and maintain its electrical characteristics even if thin-film external electrodes are broken or damaged. In particular, in the case of a ladder filter incorporating a plurality of piezoelectric resonators described above, even if the thin-film external electrodes of one piezoelectric resonator are broken, the ladder filter function can be reliably secured to significantly improve reliability of such a component.

To summarize, according to preferred embodiments of the present invention, even if thin-film external electrodes are broken or damaged by the expansion or contraction of an insulating film due to a temperature change or other condition, the function of a resonator is not affected because of the existence of the first and second conductive resin films disposed on the first and second thin-film external electrodes, respectively, so that a highly reliable piezoelectric resonator can be obtained. Similarly, in an electronic component using the novel piezoelectric resonator according to at least one preferred embodiment of the present invention, high reliability is achieved. In addition, by changing the coating amount and shape of the conductive resin films, a damping of the vibration in a base member and Qm of the resonator are greatly improved. Therefore, a degree of freedom in designing a piezoelectric resonator and an electronic component is also excellent.

The above-described elements, features and advantages of the present invention will be apparent from the following description of preferred embodiments with reference to the drawings.

BRIEF DESCRIPTION OF THE DRAWINGS

FIG. 7($a$) and FIG. 7($b$) are illustrations respectively showing a plan view and a side view of a condition in which the laminate shown in FIG. 6 is provided with an insulating film.

FIG. 8($a$) and FIG. 8($b$) are illustrations respectively showing a plan view and a side view of a condition in which the laminate shown in FIG. 7($a$) and FIG. 7($b$) is provided with a thin-film external electrode and a conductive resin film.

FIG. 13 is an exploded perspective view showing a preferred embodiment of a ladder filter in which a piezoelectric resonator of the present invention is used.

DETAILED DESCRIPTION OF PREFERRED EMBODIMENTS

Figure 1:
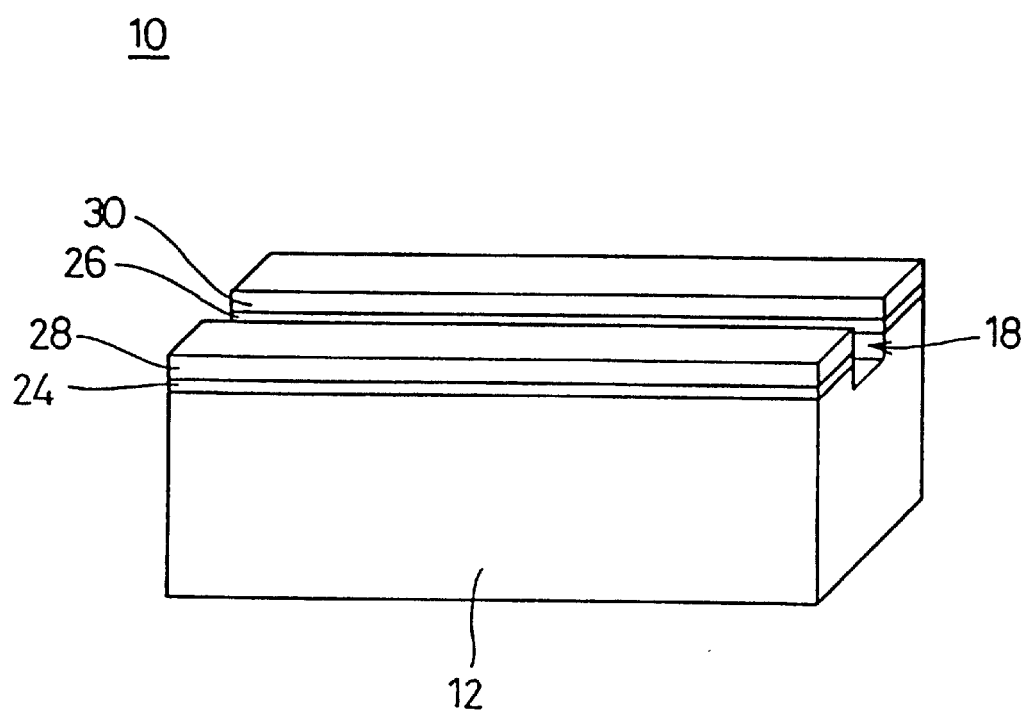
FIG. 1 is a perspective view showing a preferred embodiment of a piezoelectric resonator according to the present invention.
Figure 2:
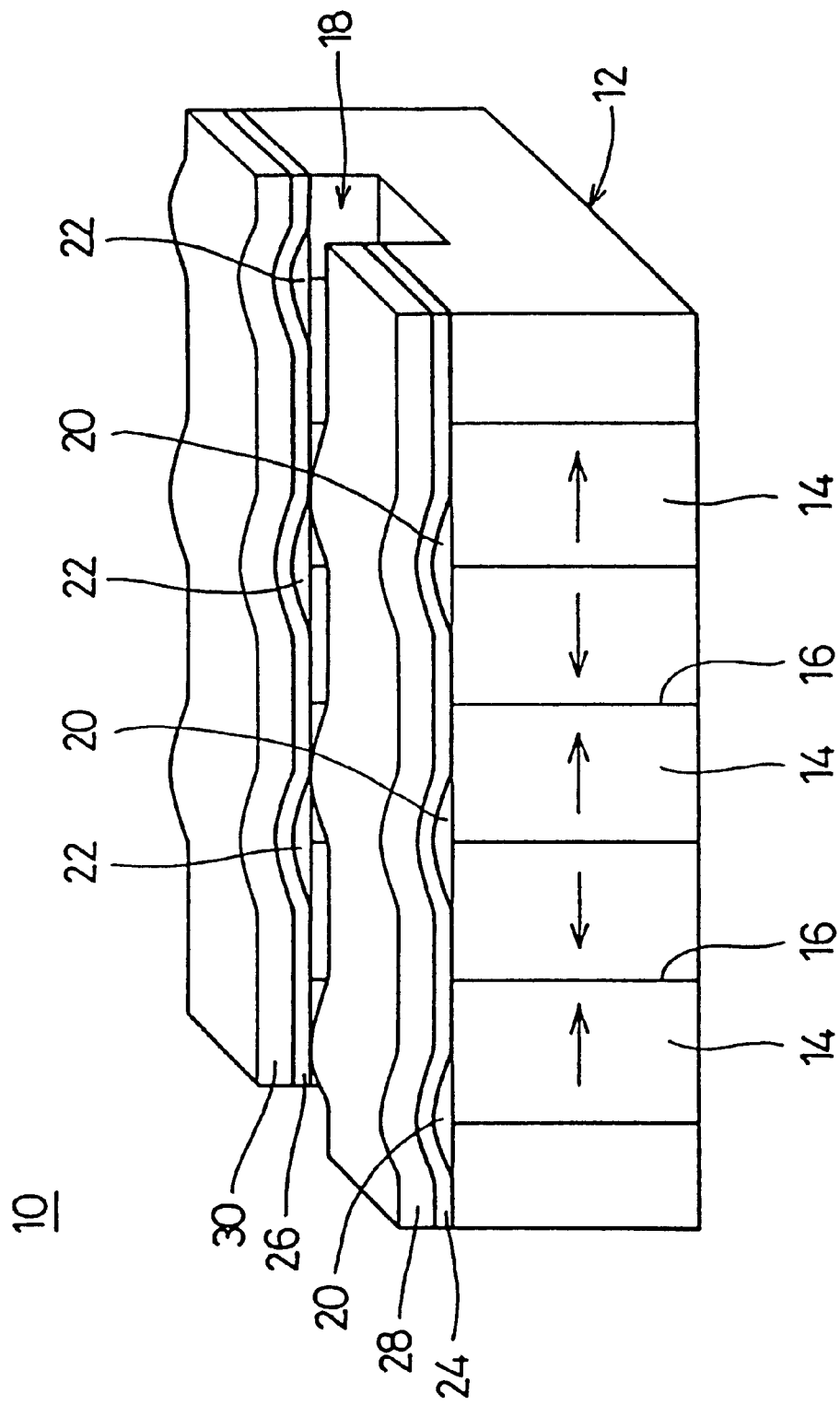
FIG. 2 is an illustration of the piezoelectric resonator shown in FIG. 1.

FIG. 1 is a perspective view showing one preferred embodiment of a piezoelectric resonator of the present invention, and FIG. 2 is an illustration of the preferred embodiment. A piezoelectric resonator 10 includes a base member 12 which is preferably formed by alternately stacking and laminating a plurality of piezoelectric layers 14 and internal electrodes 16. As indicated by the arrows in FIG. 2, adjacent piezoelectric layers 14, each located between two adjacent internal electrodes 16, are polarized in opposite directions in the longitudinal direction of the base member 12. However, the piezoelectric layers 14, which are at the ends of the base member 12 along the longitudinal direction, are preferably not polarized in this preferred embodiment. However, the ends of the base member 12 may be polarized if necessary. Also, in the case where piezoelectric layers which are not polarized are provided, the locations of such unpolarized piezoelectric layers in the base member 12 are arbitrary.

On one side surface of the base member 12, preferably an approximately central portion of a width thereof, a groove 18 extending in the longitudinal direction of the base member 12 is provided. On one side of the groove 18, exposed portions of the internal electrodes 16 are coated with first insulating films 20, with some portion thereof preferably being left uncoated. On another side of the groove 18, the exposed portions of the internal electrodes 16 which are not coated via the first insulating films 20, are coated with second insulating films 22. Accordingly, on both sides of the groove 18, the exposed portions of the internal electrodes 16 are alternately coated with the first insulating films 20 and the second insulating films 22.

In addition, on one side of the groove 18, and on the side surface of the base member 12 on which the first insulating films 20 are located, a first thin-film external electrode 24 is provided. Thus, a first group of the internal electrodes 16 which are not coated with the first insulating films 20, are electrically connected to the first thin-film external electrode 24. Also, on another side of the groove 18, and on the side surface of the base member 12 on which the second insulating films 22 are disposed, a second thin-film external electrode 26 is provided. Thus, a second group of the internal electrodes 16 which are not coated with the second insulating films 22, are electrically connected to the second thin-film external electrode 26. The internal electrodes 16 disposed in the base member 12 do not always need to be alternately connected to different thin-film external electrodes. For example, the internal electrodes 16 which are adjacent, may be connected to one identical thin-film external electrode, or may include an internal electrode which is not completely connected to a thin-film external electrode. The groove 18 is optional and may be provided if desired, but does not always need to be provided.

On the first thin-film external electrode 24, a first conductive resin film 28 is provided. Thus, the first conductive resin film 28 is electrically connected to the first thin-film external electrode 24. Also, on the second thin-film external electrode 26, a second conductive resin film 30 is provided. Thus, the second conductive resin film 30 is electrically connected to the second thin-film external electrode 26.

Figure 3:
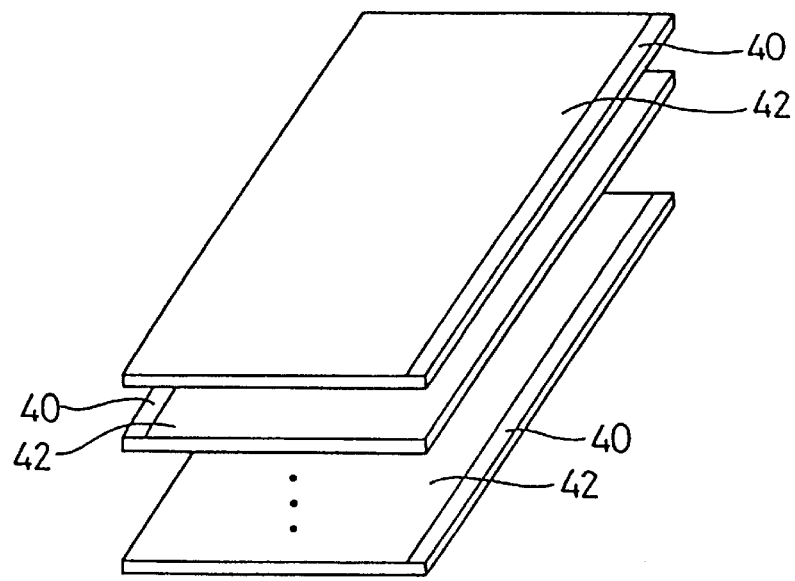
FIG. 3 is a perspective view showing a condition in which ceramic green sheets are laminated to produce the piezoelectric resonator shown in FIG. 1.
Figure 4:
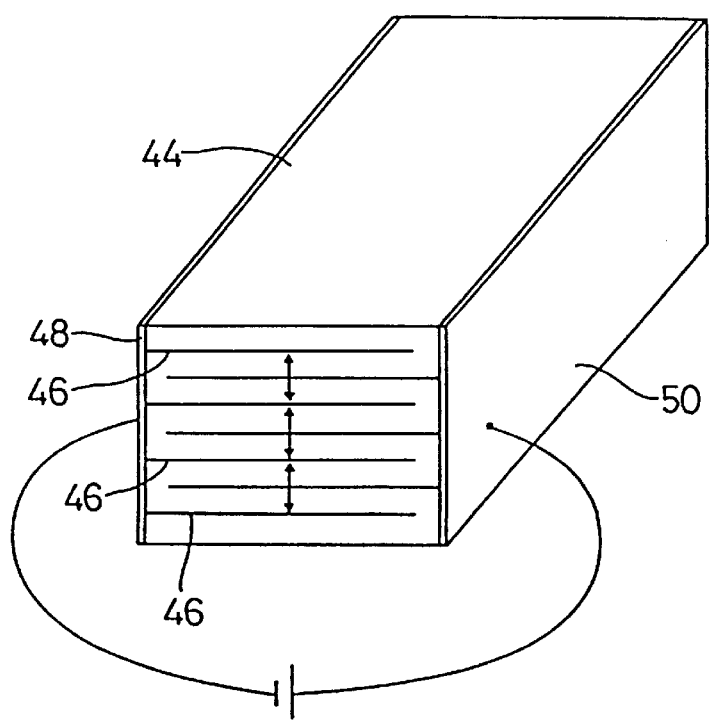
FIG. 4 is an illustration showing a laminate base made of the ceramic green sheets shown in FIG. 3.

To produce the piezoelectric resonator 10, piezoelectric ceramic green sheets 40 are initially prepared as shown in FIG. 3. Conductive paste including, for example, silver, palladium, an organic binder, etc. is applied on one surface of one green sheet 40 to form a conductive paste layer 42. The conductive paste layer 42 is disposed on the entire surface excluding one end of the green sheet 40. The plurality of green sheets 40 are laminated. At this time, the green sheets 40 are laminated so that their ends on which the conductive paste layers 42 are not formed are arranged in opposite directions. By applying the conductive paste on the opposite sides of the laminate and firing it, a laminate base 44 as shown in FIG. 4 is formed. Here, for convenience of description, an eight-layered green-sheet laminate is described. However, as shown in FIG. 2, this is similar to the case where a seven-layered laminate is produced. Other configurations including other numbers of layers may also be used.

In the laminate base 44, the plurality of internal electrodes 46 are formed by firing the conductive paste layers 42. The internal electrodes 46 are alternately exposed at opposing portions of the laminate base 44. On the opposing portions of the laminate base 44, polarizing electrodes 48, 50 alternately connected to the internal electrodes 46 are provided. By applying a DC voltage across the polarizing electrodes 48, 50, the polarization of the laminate base 44 is performed. At this time, in the laminate base 44, high DC electric fields are applied to the internal electrodes 46, which are adjacent to each other, and the directions of the electric fields are alternately reversed relative to each other. Accordingly, the laminate base 44 is polarized in opposite directions on both sides of each internal electrode 46, as indicated by the arrows in FIG. 4.

Figure 5:
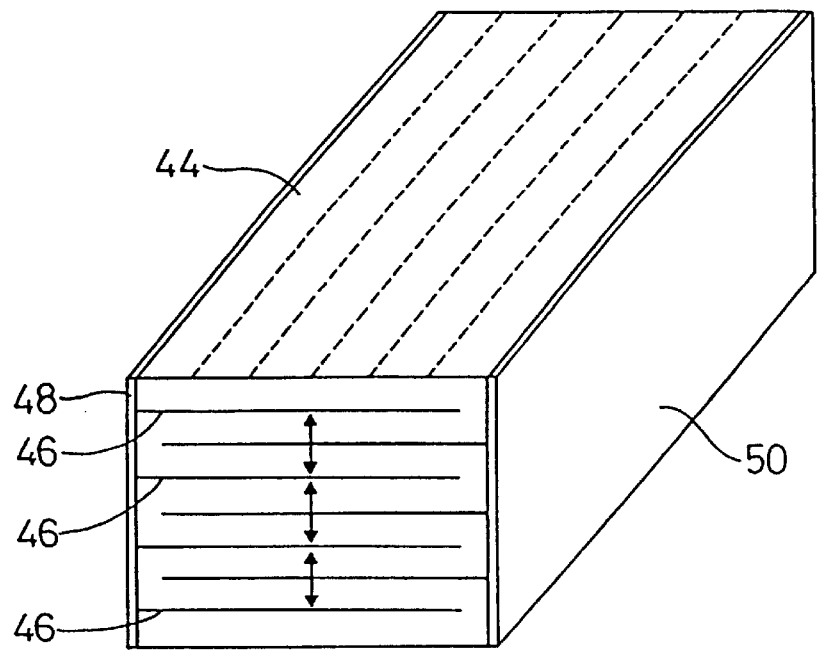
FIG. 5 is an illustration showing a section of the laminate base shown in FIG. 4.
Figure 6:
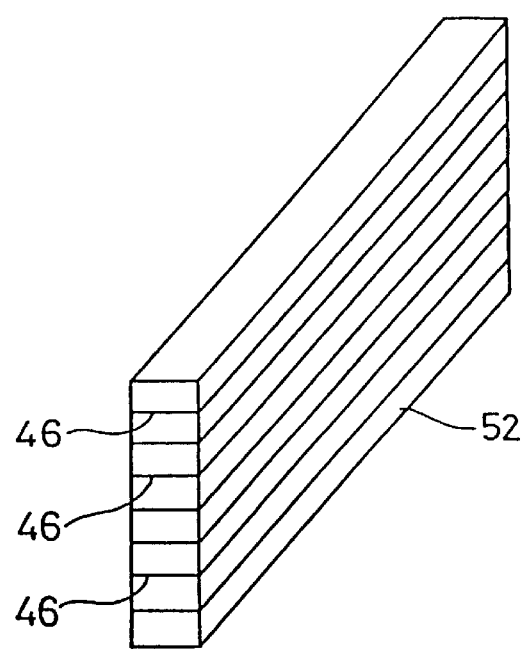
FIG. 6 is an illustration showing a laminate formed by cutting the laminate base shown in FIG. 4.

Next, as indicated by the dotted lines in FIG. 5, the laminate base 44 is cut in a direction that is substantially perpendicular to the internal electrodes 46 by a dicer or the like. This forms a laminate 52 in which ends of the internal electrodes 46 are exposed, as shown in FIG. 6. As shown in FIG. 7, on one side surface of the laminate 52, insulating films 54 are arranged so as to define a checkerboard pattern. FIG. 7 is a simplified view of FIG. 6, in which a reduced number of layers is shown. One row of the checkerboard insulating films 54 which is substantially perpendicular to the internal electrodes 46, are alternately formed on the internal electrodes 46. On one adjacent checkerboard row, the insulating films 54 are disposed on the internal electrodes 46 on which the insulating films 54 are not provided on an adjacent row.

Figure 9:
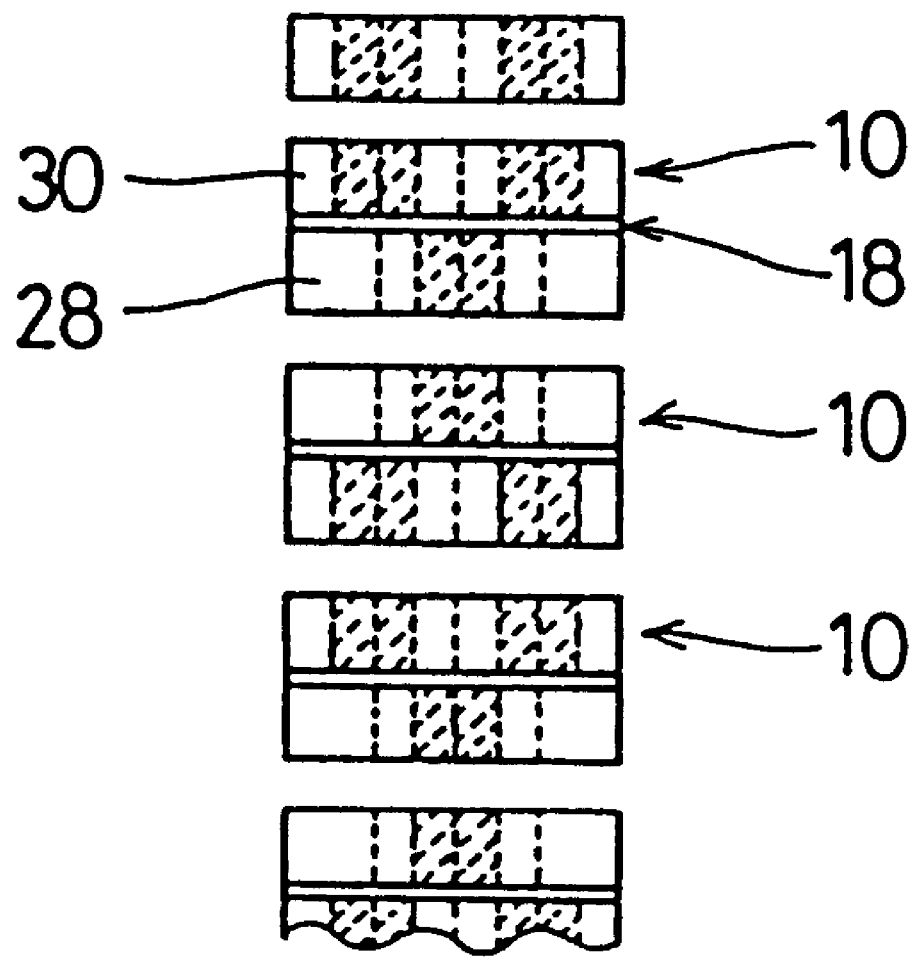
FIG. 9 is an illustration showing a step in which grooves are formed in the laminate shown in FIG. 8 and the laminate is cut to produce a piezoelectric resonator.

As shown in FIG. 3, on the surface of the laminate 52 on which the insulating films 54 are formed, a thin-film external electrode 56 is formed by sputtering or other suitable process. On the thin-film external electrode 56, a conductive resin film 58 is formed. As shown in FIG. 9, between adjacent rows of the checkerboard insulating films 54, a groove 18 is formed so as to be substantially perpendicular to the plane of the internal electrodes 46. By cutting the laminate 52 at the groove 18, the piezoelectric resonator 10 shown in FIG. 1 is formed.

In the piezoelectric resonator 10, by applying a signal across the first conductive resin film 28 and the second conductive resin film 30, opposite voltages are applied to the piezoelectric layers 14 of the base member 12, which are oppositely polarized, which causes the piezoelectric layers 14 to expand or contract. Accordingly, the entire piezoelectric resonator 10 is excited to have fundamental vibration in a longitudinal vibration mode, with the central portion of the base member 12 defining a vibration node.

In the piezoelectric resonator 10, the polarization directions of the piezoelectric layers 14, the directions of the signal-caused electric fields are the same as the vibration directions of the base member 12. In other words, the piezoelectric resonator 10 is a stiffened piezoelectric resonator. This stiffened piezoelectric resonator 10 has an electromechanical coupling coefficient larger than that of an unstiffened piezoelectric resonator in which polarization directions and electric field directions differ from vibration directions.

The first and second conductive resin films 28, 30 are disposed on the first and second thin-film external electrodes 24, 26. Thus, even if the first and second thin-film external electrodes 24, 26 are broken by the expansion or contraction of the first and second insulating films 20, 22 due to a temperature change or other condition, conduction on the sides of a broken or damaged portion in the thin-film external electrode 24 or 26 is secured by the conductive resin films 28, 30. Accordingly, if the thin-film external electrodes 24, 26 are broken or damaged, the piezoelectric resonator 10 can be normally excited.

Figure 10:
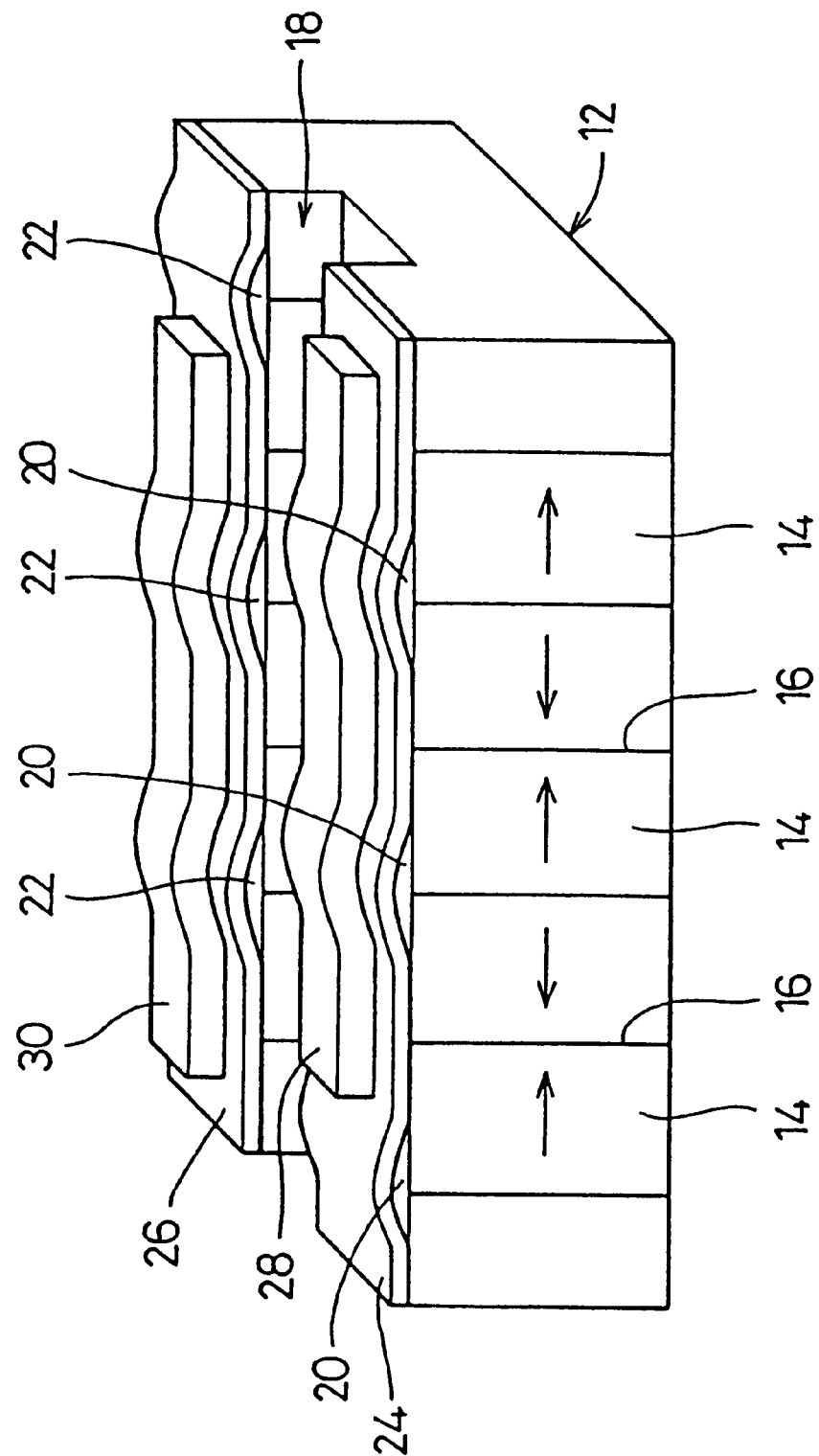
FIG. 10 is an illustration of another preferred embodiment of a piezoelectric resonator according to the present invention.

The first conductive resin film 28 and the second conductive resin film 30 do not need to be formed on the entire first thin-film external electrode 24 and the entire second thin-film external electrode 26, respectively. The first and second conductive resin films 28, 30 may be partially formed as shown in FIG. 10. Also, in this type of piezoelectric resonator 10, when the thin-film external electrodes 24, 26, on which the insulating films 20, 22 are disposed, are broken or damaged, the conduction of the external electrodes 24, 26 is secured by the conductive resin films 28, 30. In addition, a conductive resin film such as 28, 30 has the function of damping the vibration of a piezoelectric resonator. Thus, as the areas of the conductive resin films 28, 30 increase, Qm of the piezoelectric resonator 10 decreases. Therefore, by changing the area or shape of the conductive resin film 28 or 30, Qm of the piezoelectric resonator 10 is advantageously adjusted.

Figure 11:
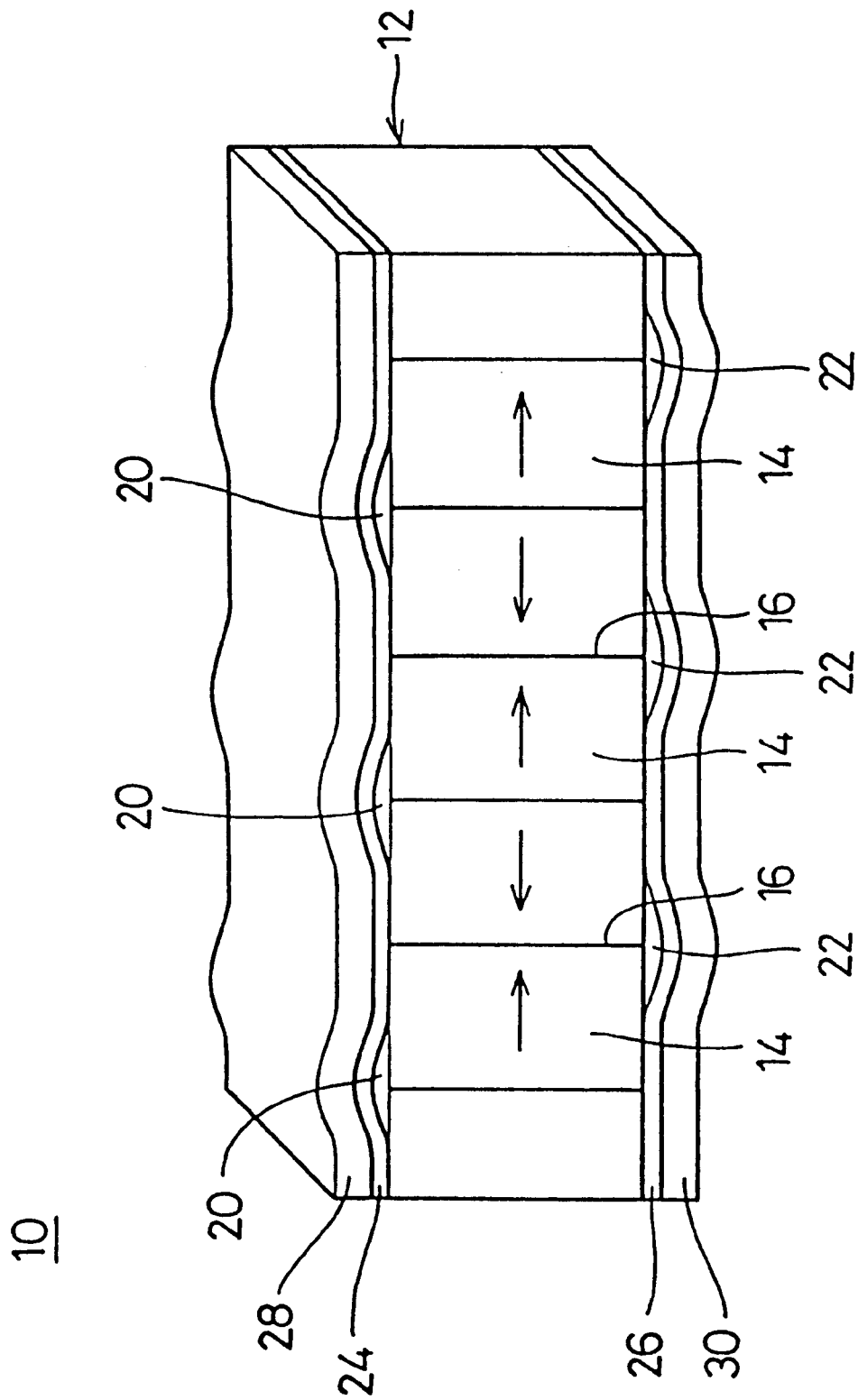
FIG. 11 is an illustration of a further preferred embodiment of a piezoelectric resonator according to the present invention.

As shown in FIG. 11, first insulating films 20 and second insulating films 22 may be arranged on the opposing side surfaces of a base member 12. In this case, on the opposing surfaces of the base member 12, different exposed portions of internal electrodes 16 are alternately coated with the first and second insulating films 20, 22. On the opposing surfaces of the base member 12 on which the insulating films 20, 22 are provided, first and second thin-film external electrodes 24, 26 are arranged. On the first and second thin-film external electrodes 24, 26, first and second conductive resin films 28, 30 are provided. Also, in this piezoelectric resonator 10, the conductive resin films 28, 30 can prevent inferior connection due to breakage of or damage to the thin-film external electrodes 24, 26.

Figure 12:
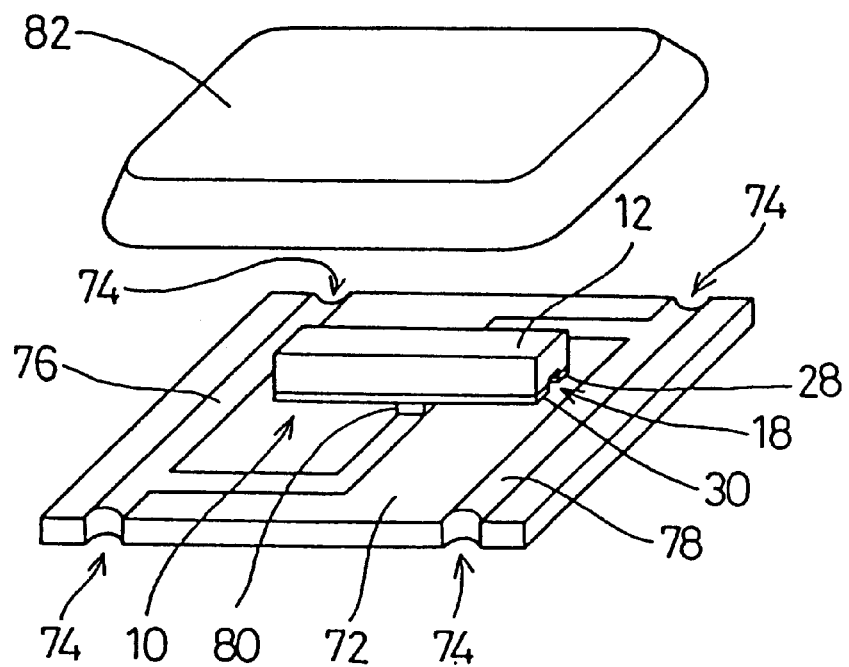
FIG. 12 is an exploded perspective view showing a preferred embodiment of an electronic component in which a piezoelectric resonator of the present invention is used.

The above-described piezoelectric resonator 10 is preferably used to produce electronic components such as an oscillator and a discriminator. FIG. 12 is a perspective view showing one example of such an electronic component 70. The electronic component 70 includes an insulating substrate 72. At opposing ends of the insulating substrate 72, pairs of depressions or recesses 74 are formed. On one surface of the insulating substrate 72, two pattern electrodes 76, 78 are provided. One pattern electrode 76 is located between one pair of opposing depressions 74 so that its one end extends to the central portion of the insulating substrate 72 preferably in the form of letter L. Another pattern electrode 73 is located between another pair of opposing depressions 74 so that its other end extends to the central portion of the insulating substrate 72 preferably in the form of letter L. The two pattern electrodes 76, 78 are located near the center of the insulating substrate 72 so as to face each other, with a distance provided between the electrodes 76, 78. Known substrates such as a glass-epoxy substrate, an alumina substrate, and a multi-layered substrate are preferably used as the insulating substrate 72. Also, a dielectric substrate or the like may be used.

In the longitudinal central portion of the base member 12, on the first and second conductive resin films 28, 30 of the piezoelectric resonator 10, a fixing member 80 including a conductive adhesive is preferably located, and the fixing member 80 is connected to and fixed on the pattern electrodes 76, 78 by conductive adhesives (not shown) or other suitable joining members, provided on the ends of the pattern electrode 76 and the pattern electrode 78 in the central portion of the insulating substrate 72. Thereby, the conductive resin films 28, 30 of the piezoelectric resonator 10 are fixed on the insulating substrate 72, and are electrically connected to the pattern electrodes 76, 78.

The insulating substrate 72 is preferably covered with a metal cap 82. At this time, insulating resin is applied on the insulating substrate 72 and the pattern electrodes 76, 78 so that the metal cap 82 and the pattern electrodes 76, 78 are not in conduction. After that, covering with the metal cap 82 completes the electronic component 70.

According to the electronic component 70, the fixing member 80, which is provided on the first and second conductive resin films 28, 30 of the piezoelectric resonator 10, causes the ends of the piezoelectric resonator 10 to be located away from the insulating substrate 72 so that the vibration of the resonator 10 is not hindered. The central portion of the piezoelectric resonator 10 which defines a vibration node, is securely fixed to the substrate 72 via the fixing member 80, whereby vibration can be prevented from leaking from the piezoelectric resonator 10.

In addition, a plurality of piezoelectric resonators 10 are preferably used to produce a ladder filter. FIG. 13 is a perspective view showing an example of an electronic component used as a ladder filter having a ladder circuit. In an electronic component 70 shown in FIG. 13, four pattern electrodes 84, 86, 88, 90 are preferably disposed on an insulating substrate 72. On the pattern electrodes 84–90, a row of five lands are arranged at intervals. In this case, the first land from one end of the insulating substrate 72 is located, the second and fifth lands are disposed on the pattern electrode 86, the third land is disposed on the pattern electrode 88, and the fourth land is disposed on the pattern electrode 90.

Figure 14:
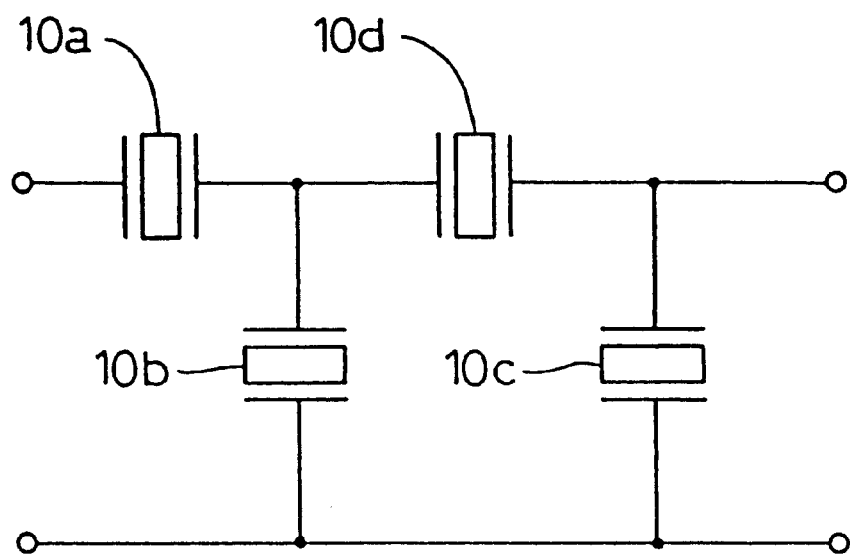
FIG. 14 is an equivalent circuit diagram of the ladder filter shown in FIG. 13.
Figure 15:
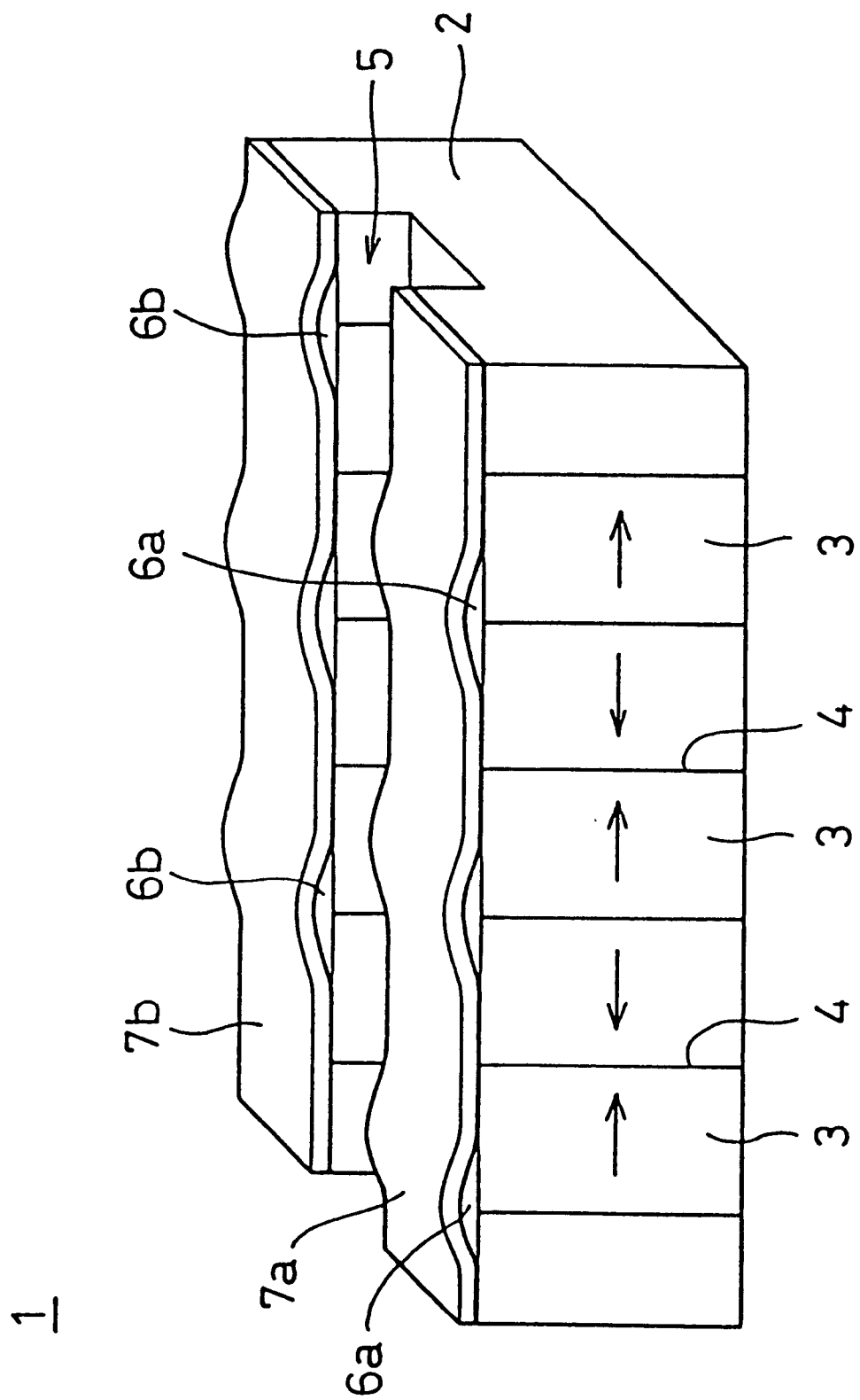
FIG. 15 is an illustration showing one example of a piezoelectric resonator which is related to preferred embodiments of the present invention.

A piezoelectric resonator 10 in which a fixing member 80 is disposed on the first and second conductive resin films 28, 30 is mounted on the fixing member 80 and each land of the substrate 72 via a conductive adhesive. In this case, piezoelectric resonators 10a to 10d are mounted so that a ladder circuit shown in FIG. 14 is obtained. The insulating substrate 72 is preferably covered with a metal cap (not shown).

The electronic component shown in FIG. 12 or FIG. 13 can be made as a highly reliable electronic component in which the function of a piezoelectric resonator cannot be damaged by breakage of a thin-film external electrode.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:

a base member having a longitudinal direction and including a laminated body having a plurality of piezoelectric layers and a plurality of internal electrodes which are alternately stacked, said piezoelectric layers being polarized in the longitudinal direction of said base member, said base member vibrating in a longitudinal vibration mode in response to application of electric fields in the longitudinal direction of said base member;

first insulating films disposed on a first side surface of said base member so as to cover at least part of exposed portions of a first group of said internal electrodes;

second insulating films disposed on a second side surface of said base member so as to cover at least part of exposed portions of a second group of said internal electrodes which are not covered with said first insulating films;

a first thin-film external electrode extending continuously in the longitudinal direction of said base member on said first insulating films;

a second thin-film external electrode extending continuously in the longitudinal direction of said base member on said second insulating film; and a first conductive resin film and a second conductive resin film respectively provided on said first thin-film external electrode and said second thin-film external electrode.

2. The piezoelectric resonator according to claim 1, wherein said base member has a groove formed therein to extend along said longitudinal direction of said base member, said first thin-film external electrode and said second thin-film external electrode being located on opposite sides of said groove.

3. The piezoelectric resonator according to claim 1, wherein said first conductive resin film covers less than an entire surface area of said first thin-film external electrode and said second conductive resin film covers less than an entire surface area of said second thin-film external electrode.

4. The piezoelectric resonator according to claim 1, wherein said first conductive resin film covers an entire surface area of said first thin-film external electrode and said second conductive resin film covers an entire surface area of said second thin-film external electrode.

5. The piezoelectric resonator according to claim 1, wherein said first insulating films and said second insulating films are respectively arranged to extend a widthwise direction at one end and another end of said base member on one common side surface of said base member.

6. The piezoelectric resonator according to claim 1, wherein said first insulating films and said second insulating films are provided on opposite side surfaces of said base member.

7. An electronic component comprising:
a piezoelectric resonator including:
a base member having a longitudinal direction and including a laminated body having a plurality of piezoelectric layers and a plurality of internal electrodes which are alternately stacked, said piezoelectric layers being polarized in the longitudinal direction of said base member, said base member vibrating in a longitudinal vibration mode in response to application of electric fields in the longitudinal direction of said base member;
first insulating films disposed on a side surface of said base member so as to cover at least part of exposed portions of a first group of said internal electrodes;
second insulating films disposed on the side surface of said base member so as to cover at least part of exposed portions of a second group of said internal electrodes which are not covered with said first insulating films;
a first thin-film external electrode extending continuously in the longitudinal direction of said base member on said first insulating films;
a second thin-film external electrode extending continuously in the longitudinal direction of said base member on said second insulating film; and
a first conductive resin film and a second conductive resin film respectively provided on said first thin-film external electrode and said second thin-film external electrode;
a substrate provided with pattern electrodes to which said first and second conductive resin films of said piezoelectric resonator are electrically connected; and
a cap provided on said substrate and arranged to cover said piezoelectric resonator.

8. An electronic component according to claim 7, wherein said base member has a groove formed therein to extend along said longitudinal direction of said base member, said first thin-film external electrode and said second thin-film external electrode being located on opposite sides of said groove.

9. An electronic component according to claim 7, wherein said first conductive resin film covers less than an entire surface area of said first thin-film external electrode and said second conductive resin film covers less than an entire surface area of said second thin-film external electrode.

10. An electronic component according to claim 7, wherein said first conductive resin film covers an entire surface area of said first thin-film external electrode and said second conductive resin film covers an entire surface area of said second thin-film external electrode.

11. An electronic component comprising:
a plurality of piezoelectric resonators, at least one of said plurality of piezoelectric resonators including:
a base member having a longitudinal direction and including a laminated body having a plurality of piezoelectric layers and a plurality of internal electrodes which are alternately stacked, said piezoelectric layers being polarized in the longitudinal direction of said base member, said base member vibrating in a longitudinal vibration mode in response to application of electric fields in the longitudinal direction of said base member;
first insulating films disposed on a side surface of said base member so as to cover at least part of exposed portions of a first group of said internal electrodes;
second insulating films disposed on the side surface of said base member so as to cover at least part of exposed portions of a second group of said internal electrodes which are not covered with said first insulating films;
a first thin-film external electrode extending continuously in the longitudinal direction of said base member on said first insulating films;
a second thin-film external electrode extending continuously in the longitudinal direction of said base member on said second insulating film; and
a first conductive resin film and a second conductive resin film respectively provided on said first thin-film external electrode and said second thin-film external electrode;
a substrate provided with pattern electrodes to which said first and second conductive resin films of said at least one of said plurality of piezoelectric resonators are electrically connected; and
a cap provided on said substrate and arranged to cover said plurality of piezoelectric resonators; wherein
said plurality of piezoelectric resonators are arranged to define a ladder filter.

12. The electronic component according to claim 11, wherein each of said plurality of piezoelectric resonators include:
a base member having a longitudinal direction and including a laminated body having a plurality of piezoelectric layers and a plurality of internal electrodes which are alternately stacked, said piezoelectric layers being polarized in the longitudinal direction of said base member, said base member vibrating in a longitudinal vibration mode in response to application of electric fields in the longitudinal direction of said base member;
first insulating films disposed on a first side surface of said base member so as to cover at least part of exposed portions of a first group of said internal electrodes;
second insulating films disposed on second side surface of said base member so as to cover at least part of exposed portions of a second group of said internal electrodes which are not covered with said first insulating films;
a first thin-film external electrode extending continuously in the longitudinal direction of said base member on said first insulating films;
a second thin-film external electrode extending continuously in the longitudinal direction of said base member on said second insulating film; and
a first conductive resin film and a second conductive resin film respectively provided on said first thin-film external electrode and said second thin-film external electrode.

13. An electronic component according to claim 12, wherein for each of said plurality of piezoelectric resonators, said bas e member has a groove formed therein to extend along said longitudinal direction of said base member, said first thin-film external electrode and said second thin-film external electrode being located on opposite sides of said groove.

14. An electronic component according to claim 12, wherein for each of said plurality of piezoelectric resonators, said first conductive resin film covers less than an entire surface area of said first thin-film external electrode and said second conductive resin film covers less than an entire surface area of said second thin-film external electrode.

15. An electronic component according to claim 12, wherein for each of said plurality of piezoelectric resonators, said first conductive resin film covers an entire surface area of said first thin-film external electrode and said second conductive resin film covers an entire surface area of said second thin-film external electrode.

16. An electronic component according to claim 12, wherein for each of said plurality of piezoelectric resonators said first insulating films and said second insulating films are respectively arranged to extend a widthwise direction at one end and another end of said base member on one common side surface of said base member.

17. The electronic component according to claim 12, wherein for each of said plurality of piezoelectric resonators, said first insulating films and said second insulating films are provided on opposite side surfaces of said base member.

18. The electronic component according to claim 12, wherein:

first, second, third and fourth base members are provided as said base members;

first, second, third and fourth pattern electrodes are provided as said pattern electrode on said substrate;

said first base member is mounted on said first and second pattern electrodes;

said second base member is mounted on said second and third pattern electrodes;

said third base member is mounted on said second and fourth pattern electrodes; and said fourth base member is mounted on said third and fourth pattern electrodes.

* * * * *